United States Patent
Pan et al.

(10) Patent No.: US 11,460,519 B2
(45) Date of Patent: Oct. 4, 2022

(54) METHOD FOR MAKING A MAGNETIC GRADIOMETER WITH HIGH DETECTION ACCURACY AND SUCCESS RATE

(71) Applicants: Donghua Pan, Harbin (CN); Shengxin Lin, Harbin (CN); Liyi Li, Harbin (CN); Yuhang Ge, Harbin (CN); Yinxi Jin, Harbin (CN)

(72) Inventors: Donghua Pan, Harbin (CN); Shengxin Lin, Harbin (CN); Liyi Li, Harbin (CN); Yuhang Ge, Harbin (CN); Yinxi Jin, Harbin (CN)

(73) Assignee: Harbin Institute of Technology, Harbin (CN)

( * ) Notice: Subject to any disclaimer, the term of this patent is extended or adjusted under 35 U.S.C. 154(b) by 290 days.

(21) Appl. No.: 16/848,789

(22) Filed: Apr. 14, 2020

(65) Prior Publication Data
US 2020/0326389 A1    Oct. 15, 2020

(30) Foreign Application Priority Data
Apr. 15, 2019    (CN) .......................... 201910300864.8

(51) Int. Cl.
G01R 33/022    (2006.01)
(52) U.S. Cl.
CPC ................... G01R 33/022 (2013.01)

(58) Field of Classification Search
CPC .................................................. G01R 33/022
See application file for complete search history.

(56) References Cited

U.S. PATENT DOCUMENTS

| | | | | |
|---|---|---|---|---|
| 5,777,477 A | * | 7/1998 | Wynn | G01V 3/165 324/345 |
| 7,342,399 B1 | * | 3/2008 | Wiegert | G01R 33/022 324/345 |

\* cited by examiner

*Primary Examiner* — Walter L Lindsay, Jr.
*Assistant Examiner* — Milton Gonzalez
(74) *Attorney, Agent, or Firm* — Lili Chen (57) ABSTRACT

Provided is a method for designing a magnetic gradiometer based on the combined influence of multiple influencing parameters. The method takes into consideration of synergetic interaction of the influencing parameters on the performance of a magnetic gradiometer. It analyzes detection errors within the entire zone of all possible directions and attitudes of a magnetic target under the influence of various influencing parameters, uses the detection accuracy and detection success rate to measure the performance of the magnetic gradiometer accurately and objectively, and finally obtains the influence rule of the influencing parameters on the performance of the magnetic gradiometer. Based on the knowledge of the combined influence of multiple influencing parameters, the magnetic gradiometer can be designed to have high detection accuracy and success rate and high cost-efficiency.

1 Claim, 7 Drawing Sheets

METHOD FOR MAKING A MAGNETIC GRADIOMETER WITH HIGH DETECTION ACCURACY AND SUCCESS RATE

CROSS-REFERENCE TO RELATED APPLICATIONS

This application claims the benefit of Chinese patent application No. 201910300864.8, filed Apr. 15, 2019, the content of which is incorporated by reference herein.

FIELD OF THE INVENTION

The present invention relates to a method of designing a magnetic gradiometer based on multiple influencing parameters, which belongs to the technical field of magnetic detection.

BACKGROUND OF THE INVENTION

The magnetic target detection using a magnetic gradiometer has wide-spread applications, and more and more people become interested in and have studied the magnetic gradiometer. In the medical research field, it may be used for capsule endoscope positioning, tumor localization, surgical robot navigation, MEG research, etc. In the geophysics field, it may be used for cave mapping, oil-gas and mineral exploration, archaeological exploration, geomagnetic field monitoring, etc. In the military engineering field, it may be used for unexploded explosive detection, etc. The working principle of the magnetic gradiometer is to use an array or arrays of magnetic sensors to measure a magnetic field generated by a magnetic target, and use an inversion model on the measured data to deduce information such as position, attitude, and movement status of the magnetic target.

The performance and cost of the magnetic gradiometer are two main aspects of interest. The performance of the magnetic gradiometer mainly includes detection accuracy and detection success rate. The detection accuracy refers to the maximum detection error allowed in magnetic target detection. High detection accuracy means low maximum detection error that is allowed. The detection success rate refers to the probability that the detection error is less than the detection accuracy under a certain working condition. The level of the detection accuracy and the detection success rate reflects the performance of the magnetic gradiometer together. To design a high-performance or low-cost magnetic gradiometer, it is necessary to obtain the influence rule of various influencing parameters on the performance of the magnetic gradiometer.

The parameters involved in the design of the magnetic gradiometer mainly include the resolution of the magnetic sensor, the array form and the baseline distance. The resolution of the magnetic sensor determines the cost of the magnetic gradiometer and the minimum magnetic field that can be measured. The array form of the magnetic sensors determines the calculation mode of magnetic field data. The baseline distance determines the accuracy of the calculation. Currently, the most common array forms are cross-shaped structure and regular hexahedron structure. Moreover, the array form is often determined by the magnetic detection method. Therefore, the design of the magnetic gradiometer is mainly to determine the baseline distance and the resolution of the magnetic sensor. In the existing design of the magnetic gradiometer, the following problems generally exist:

1. In magnetic detection, it is uncertain whether the magnetic gradiometer can make the detection error less than the detection accuracy, which leads to the uncertainty of the performance of the magnetic gradiometer.

When the parameters of the magnetic gradiometer are designed at home and abroad, only the specific situation with a particular attitude of the magnetic target and a particular direction to the magnetic gradiometer (the direction of the magnetic target) is considered. However, this approach is limited because the attitude and direction of the magnetic target will affect the detection error of the detection method. Moreover, when the attitude and direction of the magnetic target have a certain relationship, the detection error can be greater than the detection accuracy, which is called a blind zone. If the magnetic target is not in the blind zone of the magnetic detection method, the detection error may be less than the detection accuracy. If the magnetic target is in the blind zone of the magnetic detection method, the magnetic target cannot be measured accurately by the magnetic gradiometer. In magnetic detection, the attitude and direction of the magnetic target are unknown or uncontrollable, which leads to the uncertainty as to whether the magnetic target is in the blind zone. This results in the uncertainty about the performance of the magnetic gradiometer, greatly reducing the use-value of the magnetic gradiometer.

2. In the process of designing the parameters of the magnetic gradiometer, the influence of various influencing parameters on the performance of the magnetic gradiometer is not systematically considered.

In the existing design methods of the magnetic gradiometer, only part of the influencing parameters that affect the performance of the magnetic gradiometer may be considered, instead of systematically designing the parameters of the magnetic gradiometer under the synergistic effect of various influencing parameters. This approach will lead to the establishment of a one-sided simulation model, which cannot well simulate the working conditions that may be encountered by the magnetic gradiometer in actual detection. As a result, the designed magnetic gradiometer may not be able to accurately detect the magnetic target during different usage conditions.

3. In the process of designing the parameters of the magnetic gradiometer, there is no influence rule of various parameters of the magnetic gradiometer on the performance of the magnetic gradiometer.

In the existing design methods of the magnetic gradiometer, the parameters of the magnetic gradiometer are often designed by using previous design experience. If the influence rules of various parameters of the magnetic gradiometer on the performance of the magnetic gradiometer are not obtained, it is impossible to know how to design various parameters to improve the performance of the magnetic gradiometer under the existing conditions, and it is also impossible to know how to reduce the cost of the magnetic gradiometer meeting certain performance requirements.

SUMMARY OF THE INVENTION

An objective of the invention is to solve the aforementioned problems and provide a method for optimizing various influencing parameters of a magnetic gradiometer to achieve high performance and high cost-efficiency. A complete simulation model of magnetic detection is established to simulate the actual detection conditions. Considering all attitudes and directions of the magnetic target, using the detection accuracy and detection success rate to measure the performance of the magnetic gradiometer accurately and objectively, and considering the synergistic effect of various influencing parameters, influence rules of the influencing parameters on the performance of the magnetic gradiometer are obtained. Based on the influence rule of the influencing parameters, it is possible to select the range of influencing parameters to improve the performance of the magnetic gradiometer, or to reduce the cost of a magnetic gradiometer with certain performance requirements.

The objective of the invention is achieved by the following technical solutions.

A method for making a magnetic gradiometer, comprising the following steps: a, establishing a complete magnetic detection model to calculate position and magnetic moment of a magnetic target as detected by the magnetic gradiometer, which comprises the steps of: 1) establishing a magnetic target model based on magnetic dipole model to obtain a magnetic field $\vec{B}_O$ generated only by the magnetic target; 2) superposing a noise signal generated by the noise model $No(\mu,\sigma^2)$ onto the magnetic field $\vec{B}_O$ to obtain a superposed magnetic field $\vec{B}_r$; 3) establishing a magnetic sensor model based on the resolution of the magnetic sensor and using the magnetic sensor model to perform data processing on the magnetic field $\vec{B}_r$ to obtain an output value of the magnetic sensor, $\vec{B}_S$; 4) establishing a tensor model based on the structure of the magnetic gradiometer and using $\vec{B}_S$ as an input for the tensor model data processing to obtain an output value of the magnetic gradiometer $\vec{G}$; 5) establishing an inversion model based on the magnetic detection method and using $\vec{G}$ as an input for the inversion model data processing to obtain calculated position and magnetic moment of the magnetic target;

b, establishing a direction-attitude-sphere model of the magnetic target to represent the entire zone of all possible positions and attitudes of the magnetic target, wherein the attitude of the magnetic target is represented by its unit magnetic moment vector $\vec{m}_0$, the direction of the magnetic target is represented by its unit position vector $\vec{r}_0$, and an included angle between $\vec{m}_0$ and $\vec{r}_0$ is $\phi$, wherein a direction-sphere is formed by making $\vec{r}_0$ cover the entire direction-sphere, wherein for each $\vec{r}_0$, there is an attitude-sphere formed by making $\vec{m}_0$ cover the entire attitude-sphere, and wherein the coordinate system of the direction-sphere coincides with the coordinate system of the magnetic gradiometer, and the axis z' of the coordinate system of the attitude-sphere and $\vec{r}_0$ are aligned on the same straight line;

c, determining value ranges of a group of influencing parameters consisting of signal intensity of the magnetic target (Ms), resolution of magnetic sensors in the magnetic gradiometer (S), a distance ratio (K), and the magnetic field noise $No(\mu,\sigma^2)$;

d, calculating detection success rates of the magnetic gradiometer under various influencing parameters using the magnetic detection model and the direction-attitude-sphere model, and drawing a relationship graph to demonstrate the influence of various influencing parameters on the performance of the magnetic gradiometer; and f, adjusting values of the influencing parameters to design a magnetic gradiometer with high quality and/or high cost-efficiency based on the knowledge of the influence of various influencing parameters on the performance of the magnetic gradiometer.

The benefits and advantages of the invention are as follows.

(1) A complete magnetic detection model is established, and the influence of various factors on the performance of the magnetic gradiometer is considered so that various working conditions in actual detection can be simulated, and a method is provided for quantifying the performance of the magnetic gradiometer accurately and objectively.

(2) A direction-attitude-sphere analysis model is established, the influence of all combinations of the attitude and direction of the magnetic target on the detection errors is considered, and the performance of the magnetic gradiometer is determined. The performance of the magnetic gradiometer is measured objectively and accurately by the detection success rate, which provides a strong basis for designing a high-performance magnetic gradiometer.

(3) The influence rule of various influencing parameters of the magnetic gradiometer on the performance of the magnetic gradiometer is obtained. According to the influence rules of various influencing parameters on the performance of the magnetic gradiometer, it is possible to design various influencing parameters under the existing conditions to improve the performance of the magnetic gradiometer, and to reduce the cost of the magnetic gradiometer meeting certain performance requirements so that a magnetic gradiometer with high performance and high cost-efficiency is designed.

BRIEF DESCRIPTION OF THE DRAWINGS

FIG. 4-1 is a relation graph to demonstrate the influence of various influencing parameters on the detection success rate of the Lv-STAR method in the state of $No(30,0.5^2)$ (unit: nT).

FIG. 4-2 is a relation graph to demonstrate the influence of various influencing parameters on the detection success rate of the Lv-STAR method in the state of $No(0.6,0.5^2)$ (unit: nT).

FIG. 4-3 is a relation graph to demonstrate the influence of various influencing parameters on the detection success rate of the Lv-STAR method in the state of $No(30,0.001^2)$ (unit: nT).

FIG. 4-4 is a relation graph to demonstrate the influence of various influencing parameters on the detection success rate of the Lv-STAR method in the state of $No(0.6,0.001^2)$ (unit: nT).

DETAILED DESCRIPTION OF THE INVENTION

The invention will be further described in detail below with regard to the drawings. The specific embodiments are provided for illustrative purposes only, not to limit the scope of the invention which is defined by the claims.

This example relates to a method for designing various influencing parameters of a magnetic gradiometer to achieve high performance and cost-efficiency.

Figure 1:
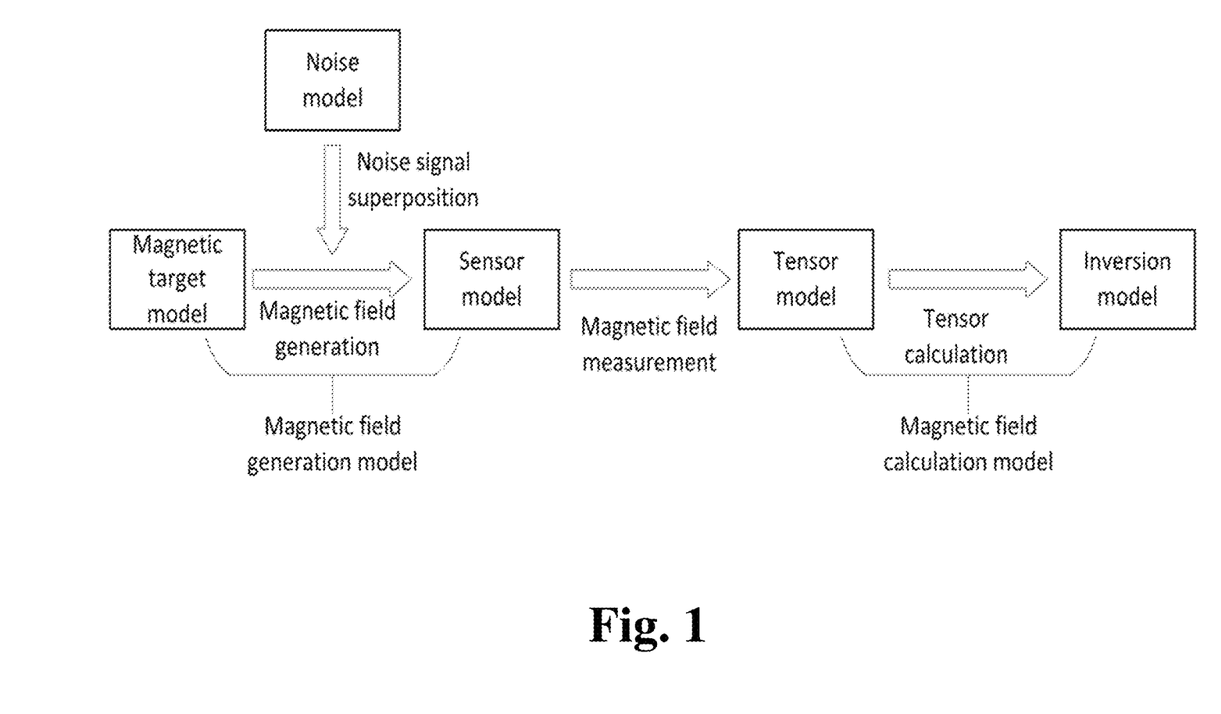
FIG. 1 is a schematic composition diagram of a magnetic detection model of the invention.

A magnetic detection model may be divided into a magnetic field generation model and a magnetic field calculation model. As shown in FIG. 1, the magnetic field generation model includes a magnetic target model, a noise model, and a sensor model. The magnetic field calculation model includes a tensor model and an inversion model. First, a magnetic target model, such as a magnetic dipole model, is established from a magnetic field expression of the magnetic target at any point in space, and a magnetic field $\vec{B}_O$ generated only by the magnetic target is obtained. Next, a suitable noise model, such as a Gaussian white noise model, is established, and a noise signal generated by the noise model is superposed on the magnetic field $\vec{B}_O$ to obtain a superposed magnetic field $\vec{B}_r$ at the detection site. Then, in consideration of factors such as the resolution and offset of the magnetic sensor, a sensor model is established to perform certain data processing on the magnetic field $\vec{B}_r$ to obtain the output of a magnetic sensor $\vec{B}_S$. Thereafter, a tensor model is established based on the structure of the magnetic gradiometer, and $\vec{B}_S$ is used as the input for the tensor model to calculated a gradient tensor $\vec{G}$. Finally, by using the detection formula of the magnetic detection method, an inversion model is established to calculate the position and magnetic moment of the magnetic target using the gradient tensor $\vec{G}$ as the input for the inversion model.

In magnetic detection, many factors affect the performance of the magnetic gradiometer. If the influence of each factor on the performance of the magnetic gradiometer is analyzed separately, only the influence trend of each factor on the performance of the magnetic gradiometer can be obtained. The influence rule of the performance of the magnetic gradiometer under the synergistic effect of various factors cannot be obtained. The factors that have the same influence effect are classified into the same category, which are called the influencing parameter. The introduction of influencing parameters is conducive to analyze the performance of the magnetic gradiometer and summarize the rules with better regularity and practicality.

Next, the establishment of each model and the determination of influencing parameters are explained in detail.

Magnetic Target Model:

When the detection distance is more than 3 times the size of the magnetic target, the magnetic target may be regarded as a magnetic dipole. Because the detection distance is generally much larger than the size of the magnetic target itself, the magnetic target may be regarded as a magnetic dipole. The expression of the magnetic induction intensity $\vec{B}_O$ generated by the magnetic dipole at any point in space is:

$$\vec{B}_O\left(\vec{m_0}, \vec{r_0}, \frac{M}{r^3}\right) = \frac{3\mu_0(M\cdot\vec{m_0}\cdot\vec{r_0})\vec{r_0} - \mu_0 M\cdot\vec{m_0}}{4\pi r^3} = \frac{\mu_0}{4\pi}\cdot\frac{M}{r^3}(3(\vec{m_0}\cdot\vec{r_0})\vec{r_0} - \vec{m_0}) \quad (1)$$

wherein the vacuum permeability $\mu_0 = 4\pi \times 10^{-7}$ T·m/A, M is the magnitude of the magnetic moment of the magnetic target, r is the distance between the magnetic target and magnetic sensor, $\vec{m_0}$ and $\vec{r_0}$ are the unit magnetic moment vector and position vector, respectively. As can be seen from formula (1), the magnetic field of a magnetic dipole at this point is greatly determined by $M/r^3$. For the convenience of analysis, $\lg(M/r^3)$ is taken as the first influencing parameter and is called the magnetic source signal intensity Ms. Then, formula (1) may be rewritten as:

$$\vec{B}_O(\vec{m_0}, \vec{r_0}, Ms) = \frac{\mu_0}{4\pi}\cdot(3(\vec{m_0}\cdot\vec{r_0})\vec{r_0} - \vec{m_0})\cdot 10^{Ms} \quad (2)$$

Noise Model:

Magnetic field noise is the interfering magnetic field signal superposed on the magnetic field to be measured and is divided into a DC magnetic field noise and an AC magnetic field noise. Outside the magnetically shielded room, the DC magnetic field noise is dominated by the geomagnetic field. The geomagnetic field is omnipresent on the earth, and it is difficult to strip the geomagnetic field directly from the measured magnetic field. Scholars have proposed some methods of geomagnetic field compensation, which may control the geomagnetic field compensation error to about 30 nT. Scholars mainly use a Gaussian white noise with a mean of zero and a standard deviation of 0.5 nT to 3 nT as a model of the AC magnetic field noise. Inside the magnetically shielded room, the DC magnetic field noise does not exceed 0.6 nT, and the peak-to-peak value of the AC magnetic field noise does not exceed 4 pT. According to the $3\sigma$ principle of Gaussian distribution, the standard deviation of the AC magnetic field noise inside the magnetically shielded room does not exceed ⅔ pT. Therefore, Gaussian white noise $No(\mu,\sigma^2)$ with a mean value $\mu$ and a standard deviation a as the noise model, which is also a second influencing parameter.

Sensor Model:

The magnetic sensor plays the role of measuring the magnetic field of the magnetic target in the detection. Whether the magnetic sensor can obtain an accurate magnetic field greatly affects the detection error. The factors that affect the accuracy of the magnetic field measurement of the magnetic sensor are mainly resolution, production errors, and installation errors. The production errors of the sensor mainly refer to the offset, scale factor, and nonorthogonality. The installation errors mainly refer to the misalignment error between sensors when the sensors are assembled into a magnetic gradiometer. The invention mainly considers the influence of the resolution of the magnetic sensor. The resolution of the magnetic sensor is crucial for the sensor to obtain high-fidelity output, and determines, to a large extent, the price of the sensor. The resolution of the magnetic sensor is taken as the third influencing parameter, which is represented by S. Sensors currently used for magnetic target detection include proton magnetometers, optical pump magnetometers, superconducting quantum interferometers, fluxgate magnetometers, and anisotropic magnetoresistive magnetometers. Their resolution may reach $10^{-15}$ to $10^{-10}$ T.

By combining the magnetic target model, the noise model and the sensor model, the expression of the magnetic field $\vec{B}_r$ at the detection site may be obtained as:

$$\vec{B}_r = \vec{B}_O(\vec{m_0},\vec{r_0},Ms) + No(\mu,\sigma^2) \quad (3)$$

The expression of the output of the sensor $\vec{B}_S$ is:

$$\vec{B}_S(\vec{B}_r, S) = \left[\frac{\vec{B}_r}{S}\right]\cdot S + \left[2\left(\frac{\vec{B}_r}{S} - \left[\frac{\vec{B}_r}{S}\right]\right)\right]\cdot S \quad (4)$$

The function [x] represents the largest integer not exceeding x.

Tensor Model:

The magnetic gradient tensor $\vec{G}$ is the gradient of three components of the magnetic field along three axes of the coordinate. The expression is:

$$\vec{G} = \nabla \vec{B} = \begin{bmatrix} \partial B_x/\partial x & \partial B_x/\partial y & \partial B_x/\partial z \\ \partial B_y/\partial x & \partial B_y/\partial y & \partial B_y/\partial z \\ \partial B_z/\partial x & \partial B_z/\partial y & \partial B_z/\partial z \end{bmatrix} = \begin{bmatrix} G_{xx} & G_{xy} & G_{xz} \\ G_{yx} & G_{yy} & G_{yz} \\ G_{zx} & G_{zy} & G_{zz} \end{bmatrix} \quad (5)$$

In an observation area without space current density, the divergence and rotation of the magnetic field are both 0, so the magnetic gradient tensor $\vec{G}$ has symmetry, that is, $$\begin{cases} B_{xy} = B_{yx} \\ B_{xz} = B_{zx} \\ B_{yz} = B_{zy} \\ B_{xx} + B_{yy} + B_{zz} = 0 \end{cases} \quad (6)$$

According to formula (6), 5 of 9 elements of the magnetic gradient tensor are independent, and only 5 elements need to be measured to obtain the magnetic gradient tensor. In magnetic detection, the magnetic gradient tensor is generally calculated by a magnetic gradiometer composed of a magnetic sensor array. On an axis, a distance between the two sensors is called the baseline distance that is represented by D. In combination with the magnetic field generation model, the elements in the magnetic gradient tensor can be calculated as:

$$G_{ij}(B_S, D) = \frac{B_{S,i}^{j+} - B_{S,i}^{j-}}{D} \quad (7)$$

wherein i=x,y,z,j=x,y,z, and $B_{S,i}^{j+}$ represents a component i of the magnetic sensor output in the positive direction of an axis j.

In the case where the distance between the magnetic target and the sensor is constant, if the baseline distance is too small, the magnetic field variation between two sensors will be less than the resolution of the magnetic sensor, and a numerical difference is zero, which affects the calculation accuracy of the magnetic gradient tensor seriously. If the baseline distance is too large, it will also affect the calculation accuracy of the magnetic gradient tensor. Because a first-order partial derivative is a basis for obtaining a high-order partial derivative, the first-order partial derivative is taken as an example for analysis. A theoretical value $$\frac{\partial \vec{B}}{\partial r}$$

of the first-order partial derivative of the magnetic dipole is:

$$\frac{\partial \vec{B}}{\partial r} = \frac{\mu_0 M}{4\pi} (3(\vec{m_0} \cdot \vec{r_0})\vec{r_0} - \vec{m_0}) \cdot \left(-\frac{3}{r^4}\right). \quad (8)$$

A difference value $$\frac{\partial \vec{B'}}{\partial r}$$

of the first-order partial derivative is:

$$\frac{\partial \vec{B'}}{\partial r} = \frac{\vec{B_1'} - \vec{B_2'}}{D} = \frac{\mu_0 M}{4\pi} (3(\vec{m_0} \cdot \vec{r_0})\vec{r_0} - \vec{m_0}) \cdot \left(-\frac{3}{r^4}\right) \cdot \frac{1 + D^2/12r^2}{(1 - D^2/4r^2)^3}. \quad (9)$$

From formulas (6) and (7), it can be obtained that there is a coefficient between the theoretical value and the difference value of the first-order partial derivative, which is called a differential coefficient T. As T is larger, it indicates that the first-order partial derivative is more inaccurately calculated. A distance ratio K=D/r is defined, and the differential coefficient is $$T = \frac{1 + K^2/12}{(1 - K^2/4)^3}.$$

Obviously, it can be seen that when the difference coefficient T is positively related to the distance ratio K (D<r), that is, as the distance ratio is larger, the difference coefficient is larger, and the magnetic gradient tensor is more inaccurately calculated. Therefore, the distance ratio K is taken as the fourth influencing parameter.

Figure 2:
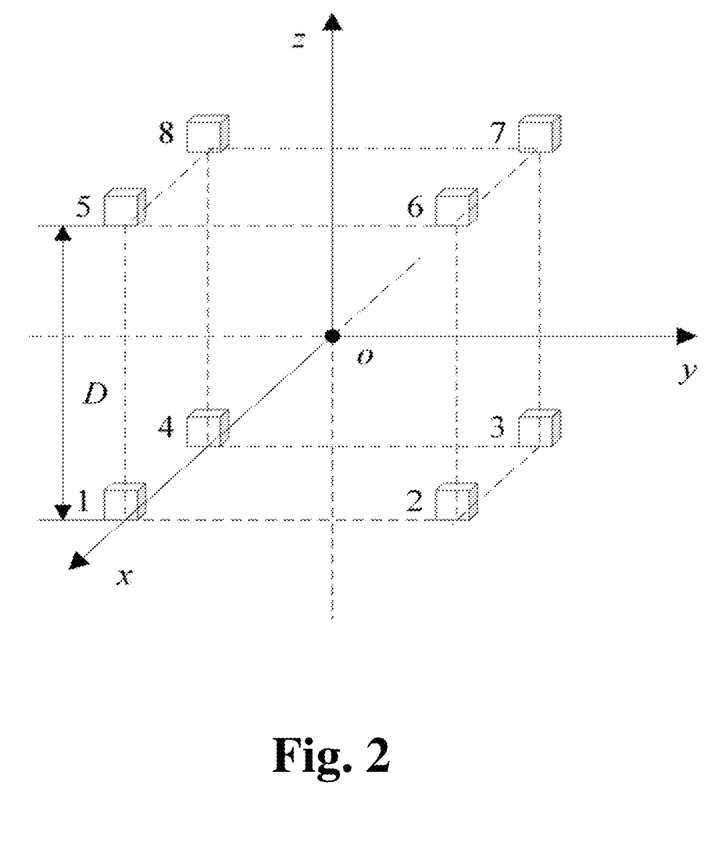
FIG. 2 is a schematic diagram of a magnetic gradiometer with a regular hexahedron structure.

Inversion Model:

In 2005, Wiegert et al. proposed a scalar triangulation and ranging (STAR) method that can quickly detect magnetic targets based on the unique properties of magnetic gradient contraction $C_T$, which has received widespread attention. But there is an asphericity error in the STAR method. In 2015, Lv et al. eliminated the asphericity error and proposed the Lv-STAR method. The Lv-STAR method is used as an example to establish an inversion model. The inversion model establishment processes of other magnetic detection methods are completely similar. The structure of the magnetic gradiometer in the Lv-STAR method is a regular hexahedron, as shown in FIG. 2. The space rectangular coordinate system is established with the center of the regular hexahedron structure as an origin. Eight magnetic sensors are at eight vertices of the regular hexahedron structure. The three axes of the sensor have the same direction as the coordinate system.

Lv proposed a new magnetic gradient contraction C without asphericity parameter, with the expression being:

$$C = \frac{\sqrt{\sum (G_{ij})^2} \cdot \sqrt{\lambda_1 \lambda_2 - 2\lambda_1 \lambda_3 - \lambda_3^2}}{3\sqrt{2\lambda_2^2 - 2\lambda_1 \lambda_3}} \quad (10)$$

wherein i=x,y,z,j=x,y,z, $\lambda_1$, $\lambda_2$ and $\lambda_3$ are three eigenvalues of the magnetic gradient tensor $\vec{G}$ arranged in descending order. According to formula (10), the magnetic gradient contraction C corresponding to six faces of the magnetic gradiometer may be calculated. The expression of a gradient $\nabla C$ of the magnetic gradient contraction C is:

$$\nabla C = \frac{1}{D}[\ C_{x+} - C_{x-}\ \ C_{y+} - C_{y-}\ \ C_{z+} - C_{z-}\ ]^T \qquad (11)$$

wherein $C_{x+}$ represents the magnetic gradient contraction C of a plane corresponding to the positive direction of the x-axis. The four sensors on the plane are labeled as 1, 2, 5, and 6, respectively. According to $\nabla C$ pointing to the magnetic target, the position vector $\vec{r}$ of the magnetic target may be calculated as:

$$\vec{r} = \begin{bmatrix} x \\ y \\ z \end{bmatrix} = \left\{ \frac{D}{2}\left(\frac{\nabla C}{|\nabla C|} \cdot \vec{Z}\right) + D\left(\frac{\nabla C}{|\nabla C|} \cdot \vec{Z}\right) \cdot \left[\left(\frac{C_{z+}}{C_{z-}}\right)^{1/4} - 1\right]^{-1} \right\} \cdot \frac{\nabla C}{|\nabla C|}. \qquad (12)$$

After the position coordinates of the magnetic target are calculated, a magnetic moment vector $\vec{m}$ of the magnetic target may be calculated according to formula (1):

$$\vec{m} = \begin{bmatrix} m_x \\ m_y \\ m_z \end{bmatrix} = \frac{2\pi r}{\mu_0} \begin{bmatrix} 3x^2 - 2r^2 & 3xy & 3xz \\ 3xy & 3y^2 - 2r^2 & 3yz \\ 3xz & 3yz & 3z^2 - 2r^2 \end{bmatrix} \begin{bmatrix} \left(\sum_{k=1}^{8} B_{x,k}\right)/8 \\ \left(\sum_{k=1}^{8} B_{y,k}\right)/8 \\ \left(\sum_{k=1}^{8} B_{z,k}\right)/8 \end{bmatrix} \qquad (13)$$

wherein x, y and z are the calculated position coordinates of the magnetic target, and $B_{x,k}$, $B_{y,k}$ and $B_k$ are three-axis components of the output of the magnetic sensor labeled k.

Figure 3:
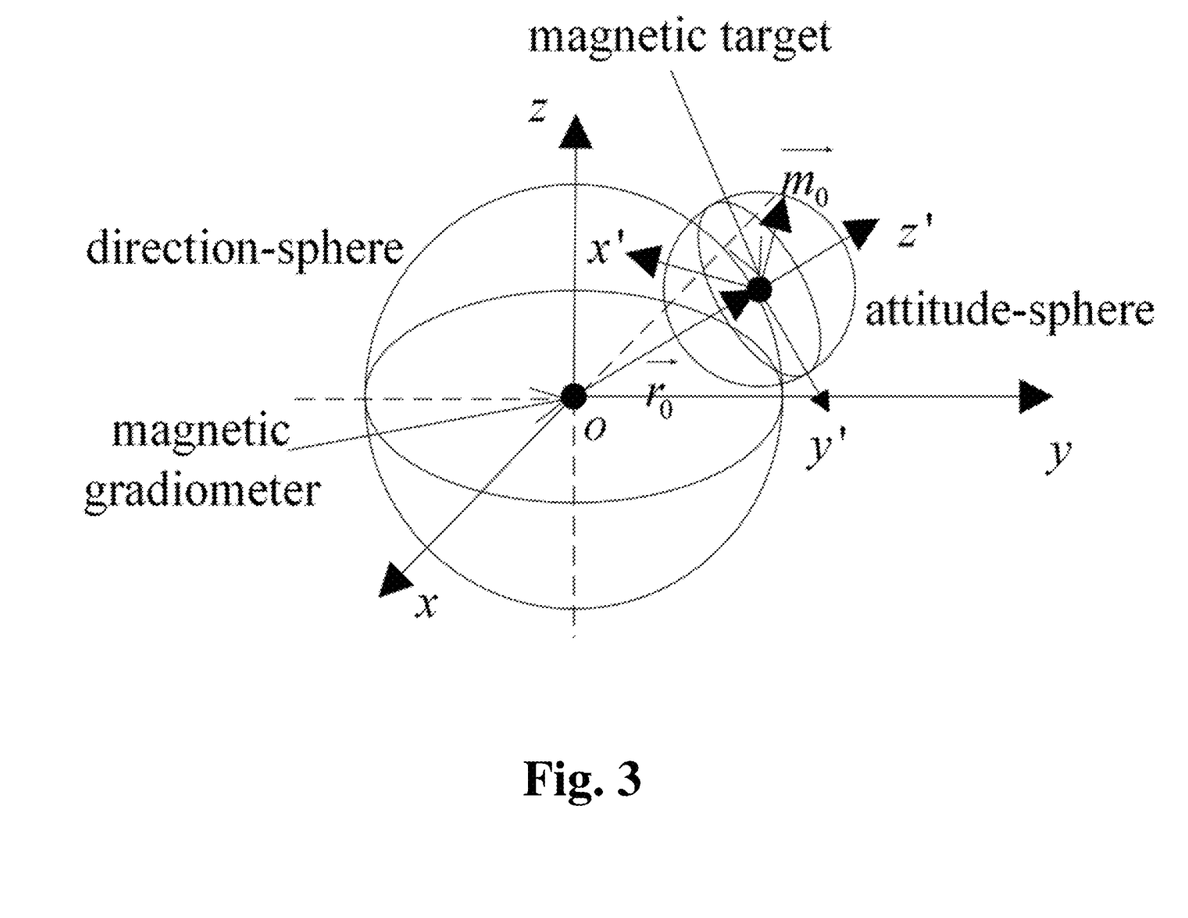
FIG. 3 is a schematic diagram of a direction-attitude-sphere analysis model.
Figure 41:
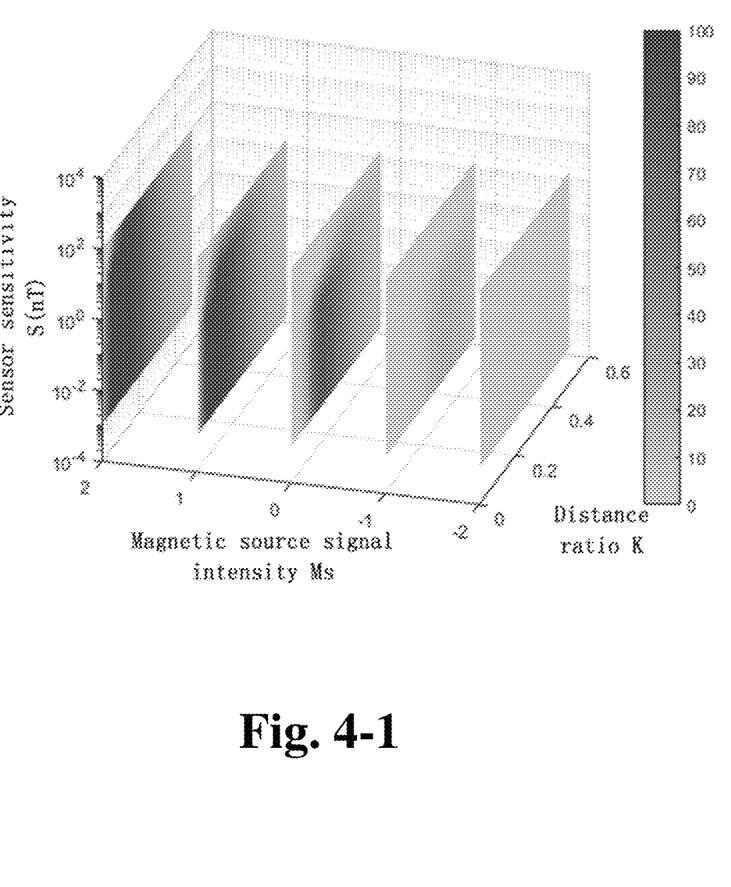
Figure 42:
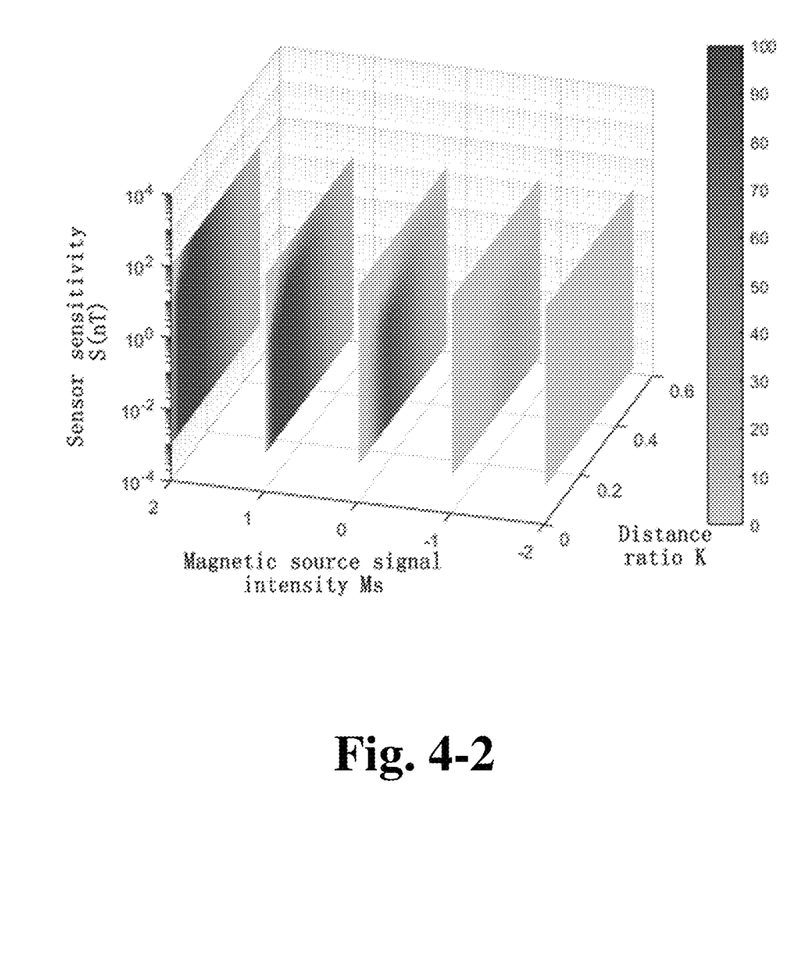
Figure 43:
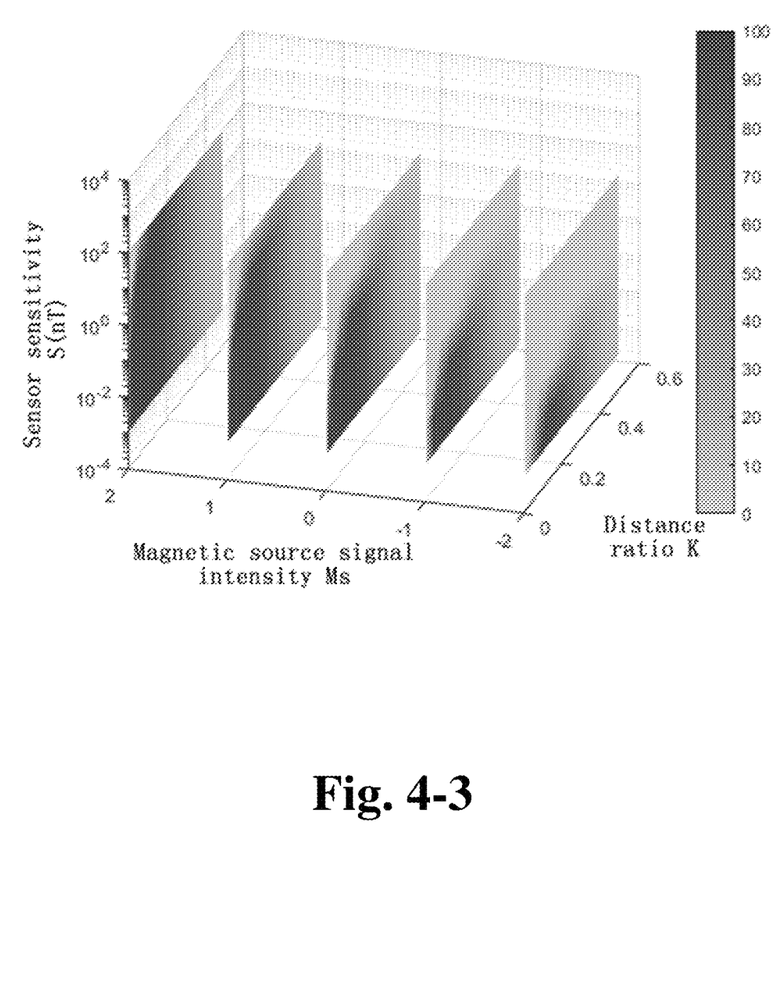
Figure 44:
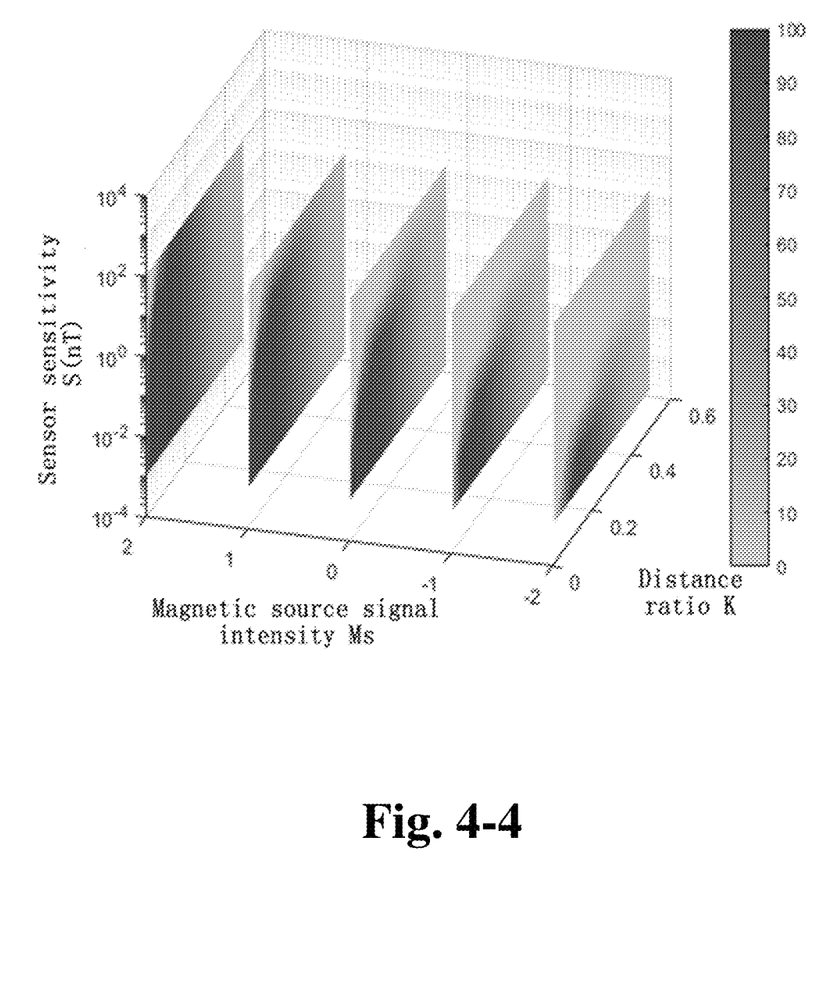

In the existing design methods of the parameters of the magnetic gradiometer parameter design method, only the specific attitude and direction of the magnetic target attitude and direction are considered. The designed magnetic gradiometer can only guarantee to detect the magnetic target in specific situations, which results in the uncertainty of the performance of the magnetic gradiometer. In order to determine and quantify the performance of the magnetic gradiometer, a direction-attitude-sphere analysis model is established, as shown in FIG. 3.

The attitude of the magnetic target is represented by the unit magnetic moment vector $\vec{m_0}$. The direction of the magnetic target to the magnetic gradiometer (the direction of the magnetic target) is represented by the unit position vector $\vec{r_0}$. An included angle between $\vec{m_0}$ and $\vec{r_0}$ is ϕ. The direction-sphere is formed by making $\vec{r_0}$ cover the entire sphere. For each $\vec{r_0}$, there is an attitude-sphere formed by making $\vec{m_0}$ cover the entire sphere. The coordinate system of the direction-sphere coincides with the coordinate system of the magnetic gradiometer. The axis z' of the coordinate system of the attitude-sphere and $\vec{r_0}$ are consistently on the same straight line. Through the direction-attitude-sphere analysis model, the influence of all combinations of values of $\vec{m_0}$ and $\vec{r_0}$ on the detection error is taken into consideration, that is, the influence of all combinations of attitudes and directions of the magnetic target on the detection error is taken into consideration. Therefore, if the performance of the magnetic gradiometer is analyzed based on the direction-attitude-sphere analysis model, the performance of the magnetic gradiometer will be determined.

Because the magnetic moment of the magnetic target is calculated from the position coordinates, the position error δ is used to measure the detection error. The expression is as follows:

$$\delta = \sqrt{(x-x_0)^2 + (y-y_0)^2 + (z-z_0)^2} \qquad (14)$$

wherein $x_0$, $y_0$, and $z_0$ are real values of position coordinates of the magnetic target, and x, y, and z are calculated values of the position coordinates of the magnetic target. The simulation corresponding to each value combination of $\vec{m_0}$ and $\vec{r_0}$ is called the sub-simulation (SS), and the simulation corresponding to all value combinations of $\vec{m_0}$ and $\vec{r_0}$ is called the global simulation (GS). In the global simulation, the sub-simulation with the detection error less than the detection accuracy is called the successful sub-simulation (SSS). In addition to the attitude and the direction of the magnetic target, each value combination of other factors that affect the detection error is called the detection situation. The calculation formula for the detection success rate DSR in a certain detection situation is:

$$DSR = (\text{Number of } SSS/\text{Number of } SS)*100\% \qquad (15).$$

It can be seen from formula (15) that the detection success rate calculated by the direction-attitude-sphere analysis model expresses the probability that the detection error of the magnetic gradiometer is less than the detection accuracy in a certain detection situation. Therefore, the detection success rate may be used to quantify the performance of the magnetic gradiometer. The higher the detection success rate, the higher the performance of the magnetic gradiometer under such a detection situation.

As an example of the invention, the Lv-STAR method is used as an example for the design of the parameters of the magnetic gradiometer. The parameter design of the magnetic gradiometer of other magnetic detection methods is completely similar. It is assumed that the detection requirements are that the detection accuracy is 0.3 m while the detection success rate is greater than 50%. The distance between the magnetic target and the magnetic gradiometer is 3 m, and the value of a magnetic source signal is changed by changing the magnitude of the magnetic moment, thereby simulating the situation of the magnetic target with different distances and magnetic moments. According to previous research, the range of the resolution of the magnetic sensor S is $10^2$ to $10^{-3}$ nT, the range of the magnetic source signal intensity Ms is 2 to −2, the distance ratio K is 0.01 to 0.49, the mean value μ of the Gauss white noise No is 30 nT and 0.6 nT, and the standard deviation σ is 0.5 nT and 0.001 nT. The values of the above influencing parameters are determined based on the actual detection condition. This example is used to illustrate the process of the parameter design for a magnetic gradiometer.

The influence of various influencing parameters on the detection success rate of the Lv-STAR method under four different noise conditions is shown in FIG. 4-1 to FIG. 4-4. The colors in the figures represent the value of the detection success rate. By comparing FIG. 4-1 and FIG. 4-2, FIG. 4-3 and FIG. 4-4, it can be seen that the DC magnetic field noise does not affect the detection success rate of the Lv-STAR method. By comparing FIG. 4-1 and FIG. 4-3, FIG. 4-2 and FIG. 4-4, the increase of the AC magnetic field noise greatly reduces the detection success rate of the Lv-STAR method. When the standard deviation of the AC magnetic field noise is 0.5 nT, the Lv-STAR method cannot be used to detect magnetic targets successfully with the magnetic source signal intensity less than 0. At the same time, it is noted that the distance ratio should not be greater than 0.3. Otherwise, the detection success rate of the Lv-STAR method is less than 50% regardless of any changes in other influencing parameters. The distance ratio should not be less than 0.1. Otherwise, the detection success rate will decrease rapidly. A high-resolution magnetic sensor is required to have a high detection success rate, which increases the cost of the magnetic gradiometer.

From the above analysis, it can be concluded that if the standard deviation a of the AC magnetic field noise in the environment where the magnetic gradiometer is used is about 0.5 nT, the magnetic gradiometer may well detect magnetic targets with the magnetic source signal intensity Ms greater than 0. At this time, the distance ratio K ranges from 0.1 to 0.3, that is, the baseline distance ranges from 0.3 to 0.9 m. At the same time, the resolution ranges from $10^{-3}$ nT to 1 nT. When the resolution of the magnetic sensor is 1 nT, the cost of the magnetic gradiometer can be minimized while meeting the requirements. Because continuing to increase the resolution does not improve the performance of the magnetic gradiometer effectively, it is not recommended to use more expensive magnetic sensors.

If the standard deviation a of the AC magnetic field noise in the environment where the magnetic gradiometer is used is about 0.001 nT, the magnetic gradiometer may well detect magnetic targets with the magnetic source signal intensity Ms greater than −2. At this time, the distance ratio K ranges from 0.1 to 0.3, that is, the baseline distance ranges from 0.3 to 0.9 m. At the same time, the resolution ranges from $10^{-3}$ nT to $10^{-2}$ nT. When the resolution is $10^{-2}$ nT, the cost of a magnetic gradiometer is the lowest.

If the standard deviation σ of the AC magnetic field noise in the environment where the magnetic gradiometer is used is 0.001 nT to 0.5 nT, the magnetic source signal intensity of the magnetic target that can be detected by the magnetic gradiometer is between −2 and 0. The distance ratio K ranges from 0.1 to 0.3, that is, the baseline distance ranges from 0.3 to 0.9 m. At the same time, the resolution ranges from $10^{-3}$ nT to $10^{-2}$ nT. When the resolution is $10^{-2}$ nT, the cost of a magnetic gradiometer is the lowest. So far, the design of the parameters of the magnetic gradiometer has been completed.

While the present invention has been described in some detail for purposes of clarity and understanding, one skilled in the art will appreciate that various changes in form and detail can be made without departing from the true scope of the invention. The specific embodiments are used herein to illustrate the concept of the invention and shall not, in any way, be construed to limit the scope of the invention which is defined by the claims. All figures, tables, appendices, patents, patent applications and publications, referred to above, are hereby incorporated by reference.

What is claimed is:

1. A method for making a magnetic gradiometer, comprising the steps of:
    a, establishing a complete magnetic detection model to calculate position and magnetic moment of a magnetic target as detected by the magnetic gradiometer, which comprises the steps of: 1) establishing a magnetic target model based on a magnetic dipole model to obtain a magnetic field ($\vec{B}_O$) generated only by the magnetic target; 2) superposing a noise signal generated by a noise model ($No(\mu,\sigma^2)$) onto the magnetic field $\vec{B}_O$ to obtain a superposed magnetic field ($\vec{B}_r$); 3) establishing a magnetic sensor model based on the resolution of the magnetic sensor and using the magnetic sensor model to perform data processing on the superposed magnetic field $\vec{B}_r$ a to obtain an output value of the magnetic sensor ($\vec{B}_S$); 4) establishing a tensor model based on the structure of the magnetic gradiometer and using the output value of the magnetic sensor ($\vec{B}_S$) as an input for the tensor model data processing to obtain an output value of the magnetic gradiometer ($\vec{G}$); 5) establishing an inversion model based on the magnetic detection method and using the output value of the magnetic gradiometer ($\vec{G}$) as an input for the inversion model data processing to obtain calculated position and magnetic moment of the magnetic target;
    b, establishing a direction-attitude-sphere model of the magnetic target to represent the entire zone of all possible positions and attitudes of the magnetic target, wherein the attitude of the magnetic target is represented by its unit magnetic moment vector ($\vec{m}_0$) the direction of the magnetic target is represented by its unit position vector ($\vec{r}_0$), and an included angle between the unit magnetic moment vector ($\vec{m}_0$) and the unit position vector ($\vec{r}_0$) is φ, wherein a direction-sphere is formed by making the unit position vector ($\vec{r}_0$) cover the entire direction-sphere, wherein for each unit position vector ($\vec{r}_0$), there is an attitude-sphere formed by making the unit magnetic moment vector ($\vec{m}_0$) cover the entire attitude-sphere, and wherein the coordinate system of the direction-sphere coincides with the coordinate system of the magnetic gradiometer, and the axis z' of the coordinate system of the attitude-sphere and the unit position vector ($\vec{r}_0$) are aligned on the same straight line;
    c, determining value ranges of a group of influencing parameters consisting of signal intensity of the magnetic target (Ms), resolution of magnetic sensors in the magnetic gradiometer (S), a distance ratio (K), and the magnetic field noise $No(\mu,\sigma^2)$;
    d, calculating detection success rates of the magnetic gradiometer under various influencing parameters using the magnetic detection model and the direction-attitude-sphere model, and drawing a relationship graph to demonstrate the influence of various influencing parameters on the performance of the magnetic gradiometer; and
    f, adjusting values of the influencing parameters to design a magnetic gradiometer with high performance and/or high cost-efficiency based on knowledge of the influence of various influencing parameters on the performance of the magnetic gradiometer.

* * * * *